United States Patent
Gillespie et al.

(10) Patent No.: US 8,226,142 B2
(45) Date of Patent: Jul. 24, 2012

(54) WORKPIECE GRIPPING INTEGRITY SENSOR

(75) Inventors: Joseph D. Gillespie, Boston, MA (US); Sor Kham, Lowell, MA (US); Robert E. Wayne, Gloucester, MA (US)

(73) Assignee: Axcelis Technologies, Inc., Beverly, MA (US)

( * ) Notice: Subject to any disclaimer, the term of this patent is extended or adjusted under 35 U.S.C. 154(b) by 390 days.

(21) Appl. No.: 12/178,014

(22) Filed: Jul. 23, 2008

(65) Prior Publication Data
US 2009/0039664 A1  Feb. 12, 2009

Related U.S. Application Data

(60) Provisional application No. 60/954,949, filed on Aug. 9, 2007.

(51) Int. Cl.
*B66F 19/00* (2006.01)
(52) U.S. Cl. ........ 294/213; 294/907; 414/730; 414/741; 414/936; 414/941; 901/34; 361/234
(58) Field of Classification Search .............. 294/1.1, 294/86.4, 907, 213; 901/34, 35; 414/730, 414/741, 936, 941; 361/234
See application file for complete search history.

(56) References Cited

U.S. PATENT DOCUMENTS

| | | | | |
|---|---|---|---|---|
| 3,660,805 | A | * | 5/1972 | McDonough ............... 439/585 |
| 4,634,107 | A | * | 1/1987 | Vandersyde et al. ........... 270/56 |
| 4,697,246 | A | * | 9/1987 | Zemke et al. ................ 702/128 |
| 5,417,464 | A | * | 5/1995 | Seaberg et al. ............... 294/88 |
| 5,606,251 | A | | 2/1997 | Ryle et al. |
| 5,988,971 | A | | 11/1999 | Fossey et al. |
| 6,075,375 | A | * | 6/2000 | Burkhart et al. ............. 324/686 |
| 6,113,165 | A | * | 9/2000 | Wen et al. .................... 294/1.1 |
| 6,275,748 | B1 | | 8/2001 | Bacchi et al. |
| 6,453,214 | B1 | | 9/2002 | Bacchi et al. |
| 6,593,756 | B1 | * | 7/2003 | Schmidt et al. ............. 324/686 |
| 6,692,049 | B2 | * | 2/2004 | Holbrooks ................ 294/103.1 |
| 6,848,194 | B2 | * | 2/2005 | Treur .............................. 34/58 |
| 6,922,324 | B1 | * | 7/2005 | Horwitz ....................... 361/234 |
| 6,932,557 | B2 | * | 8/2005 | Downs et al. ................ 414/741 |
| 2003/0036805 | A1 | * | 2/2003 | Senior ............................. 623/65 |
| 2006/0010968 | A1 | * | 1/2006 | Munekane et al. ............ 73/104 |

* cited by examiner

*Primary Examiner* — Dean Kramer
*Assistant Examiner* — Stephen Vu
(74) *Attorney, Agent, or Firm* — Eschweiler & Associates, LLC

(57) ABSTRACT

A workpiece gripping integrity device and method are provided having a charge-transfer sensing device configured to detect a change in charge associated with a gripper arm assembly based on a grip condition thereof. The charge-transfer sensing device can be configured to detect a change in capacitance between the gripper arm assembly and ground, wherein the change in capacitance is based on a grip condition of the gripper arm assembly associated with a plurality of grippers contacting the workpiece.

18 Claims, 4 Drawing Sheets

WORKPIECE GRIPPING INTEGRITY SENSOR

REFERENCE TO RELATED APPLICATION

This application claims priority to and the benefit of U.S. Provisional Application Ser. No. 60/954,949 which was filed Aug. 20, 2007, entitled WORKPIECE GRIPPING INTEGRITY SENSOR, the entirety of which is hereby incorporated by reference as if fully set forth herein.

FIELD OF INVENTION

The present invention relates generally to a workpiece gripping integrity detection system and method, and, more particularly to a workpiece gripping integrity detection system and method utilizing a charge transfer sensor.

BACKGROUND OF THE INVENTION

Workpiece implantation and handling systems are sophisticated systems that are employed in fabricating semiconductor devices including flash memory, system on chip devices, central processor units, and the like. Ion implantation systems are employed during semiconductor device fabrication to selectively implant ions and control device behavior in a process referred to as ion implantation. Ion implantation systems rely on proper performance of their constituent parts in order to properly perform ion implantation and, as a result, properly fabricate semiconductor devices.

Shortening cycle times to fabricate semiconductors is critical to the success of semiconductor manufacturing. A key factor in cycle time is the movement or handling of semiconductor workpieces throughout the process. Shortened cycle times are critical to operational success allowing lean manufacturing, lean inventory, better yields, reducing equipment downtime, and the like. Workpiece presence detection is critical for the robustness of workpiece handling in an ion implantation system and during workpiece manufacturing throughput.

Current workpiece presence sensing technology includes mechanical actuated sensors, laser reflective sensors, optical reflective sensors, proximity sensors and optical interrupt sensors. Each of these sensing methods, mentioned supra, has shortcomings, mainly particle generation and sensing uncertainty.

Mechanical actuated sensors generally require a switch, a plunger, a lever, or other actuator that makes contact with the workpiece in order to engage or activate the sensor. Unfortunately, the contact with the workpiece tends to generate particles and in addition, there is an uncertainty of how well the workpiece is held within the gripper of the handling mechanism, for example. In addition, laser reflective sensors, optical reflective sensors, and optical interrupt sensors only indicate that the workpiece is in a given position, as there is a disconnect between the sensor and the actual gripper-to-wafer contact.

The previously mentioned sensors do not provide complete information on the workpiece to gripper interaction, which leaves uncertainty as to how well the workpiece is actually gripped. Also, optical interrupt sensors generally overhang the workpiece, which is unacceptable in some cases where space is limited.

Thus, it is desirable to provide a method for allowing the detection of the gripping integrity of workpieces within fabrication, ionization, and handling processes.

SUMMARY OF THE INVENTION

The following presents a simplified summary in order to provide a basic understanding of one or more aspects of the invention. This summary is not an extensive overview of the invention, and is neither intended to identify key or critical elements of the invention, nor to delineate the scope thereof. Rather, the primary purpose of the summary is to present some concepts of the invention in a simplified form as a prelude to the more detailed description that is presented later.

The present invention in one embodiment provides a workpiece gripping integrity device, comprising a gripper arm assembly and a charge-transfer sensing device configured to detect a change in charge associated with the gripper arm assembly based on a grip condition thereof.

The present invention in another embodiment provides a method of transferring a workpiece comprising (a) setting counter equal to zero, (b) adding one to the counter, (c) attempting to grip the workpiece utilizing a gripper, (d) generating grip signal if capacitance value exceeds predetermined value, (e) releasing workpiece from retaining device if grip signal generated, (f) moving the workpiece to a desired location if grip signal generated, (g) releasing the workpiece from the gripper(s) if grip signal generated, (h) repeating attempt to grip workpiece if counter is less than N and grip signal is not generated else going to (j), (i) repeating (b)-(h); (i) warning operator that gripping of workpiece failed if the counter is equal to N, and (j) ending transfer routine.

To the accomplishment of the foregoing and related ends, the invention comprises the features hereinafter fully described and particularly pointed out in the claims. The following description and the annexed drawings set forth in detail certain illustrative aspects and implementations of the invention. These are indicative, however, of but a few of the various ways in which the principles of the invention may be employed. Other objects, advantages and novel features of the invention will become apparent from the following detailed description of the invention when considered in conjunction with the drawings.

DETAILED DESCRIPTION OF THE INVENTION

Figure 1:
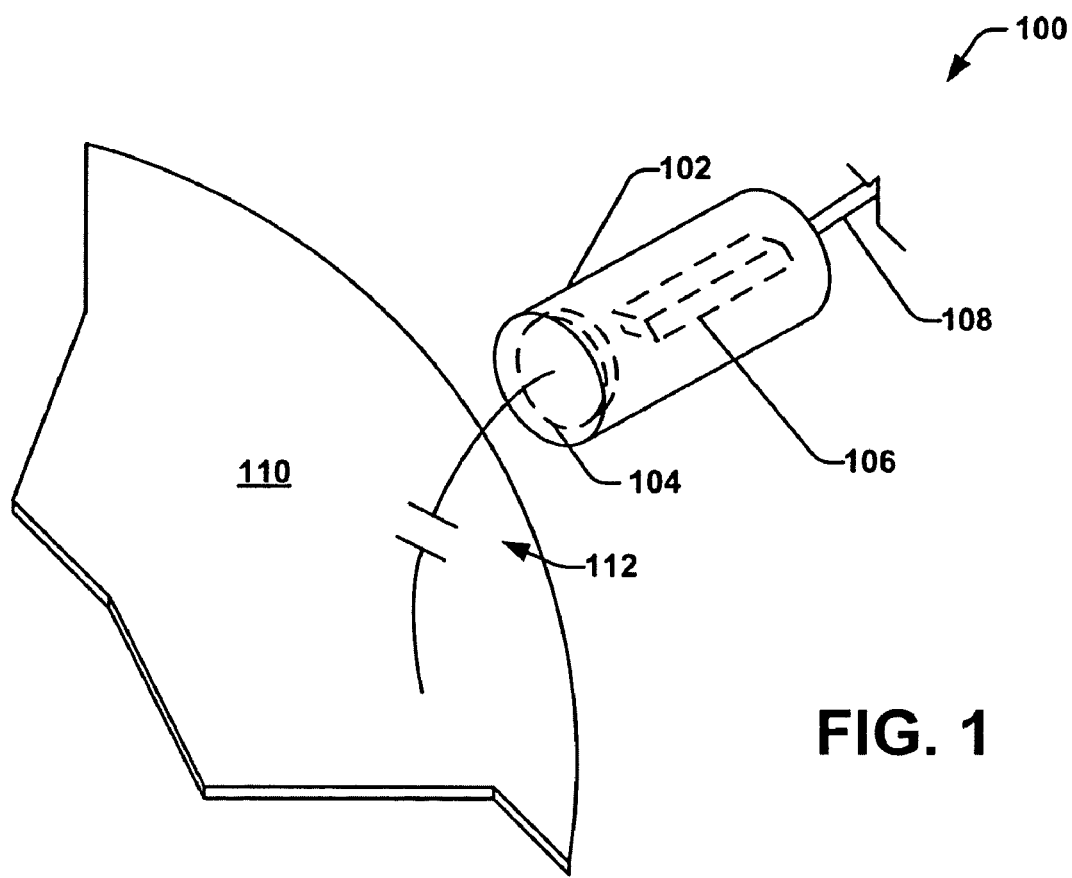
FIG. 1 illustrates an exemplary workpiece detection sensor in accordance with an aspect of the present invention.

The present invention will now be described with reference to the attached drawings, wherein like reference numerals are used to refer to like elements throughout. It will be appreciated by those skilled in the art that the invention is not limited to the exemplary implementations and aspects illustrated and described hereinafter.

The present invention facilitates workpiece handling by automatically detecting the integrity of workpiece gripping, grasping, and the like, in an ion implantation system, a workpiece handling system and a robotic system, for example. The present invention can allow the operation of the handling system, the operation of the handling system in a safe mode, or the invention can prevent operation of the handling system according to the integrity of gripping the workpiece.

Figure 2:
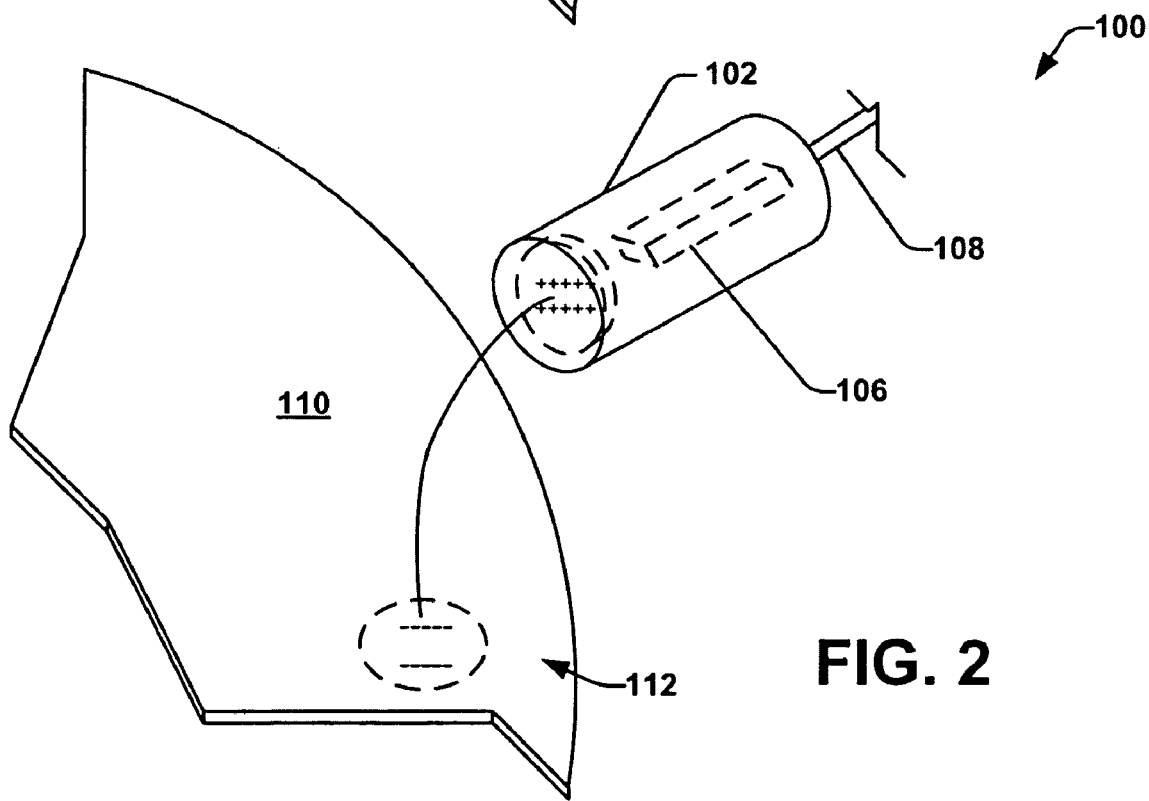
FIG. 2 illustrates the exemplary workpiece detection sensor of FIG. 1 that includes charge separation in accordance with another aspect of the present invention.

Referring now to the figures, FIG. 1 is an overview illustration of a proximity sensor 100 in accordance with an aspect of the present invention. The sensor 100 can, for example, be employed in a workpiece detection system within the ion implantation system. The sensor 100 as shown is lacking various electronic circuitry, mounting, etc., for the sake of clarity. The sensor 100 can include a cylindrical outer wall 102, a flat plate electrode 104, an internal electrical circuit 106 and wiring 108, for example. The sensor 100 can translate and/or rotate with respect to a workpiece 110, shown herein as a segment of a workpiece. When in operation the flat plate electrode 104 and the workpiece 110 together form a capacitor 112, for example, with a capacitive field formed between the electrode 104 and the workpiece 110. When the workpiece 110 is located far enough away from the sensor flat plate electrode 104 the electrical fields on both the electrode 104 and the workpiece 110 are stable, for example. The sensor 100 selected will have a determined sensing distance or range based upon the target (e.g., workpiece 110) surface area and the target material, for example. As the workpiece 110 and proximity sensor 100 come into the specified range, as illustrated in FIG. 2, the charges on the workpiece 110 (normally balanced or neutralized) separate. The negative charges on the workpiece 110 become attracted to the positive charges on the electrode 104. The negative charges on the workpiece 110 are detected by the sensor 100, as a measure of capacitance or stored charge. The proximity sensor 100 can detect the presence of the approaching workpiece 110, with or without physical contact with the workpiece 110. The inventors recognized that a contactless or actuator-free sensor would reduce or eliminate particle generation in workpiece handling systems, for example.

Figure 3:
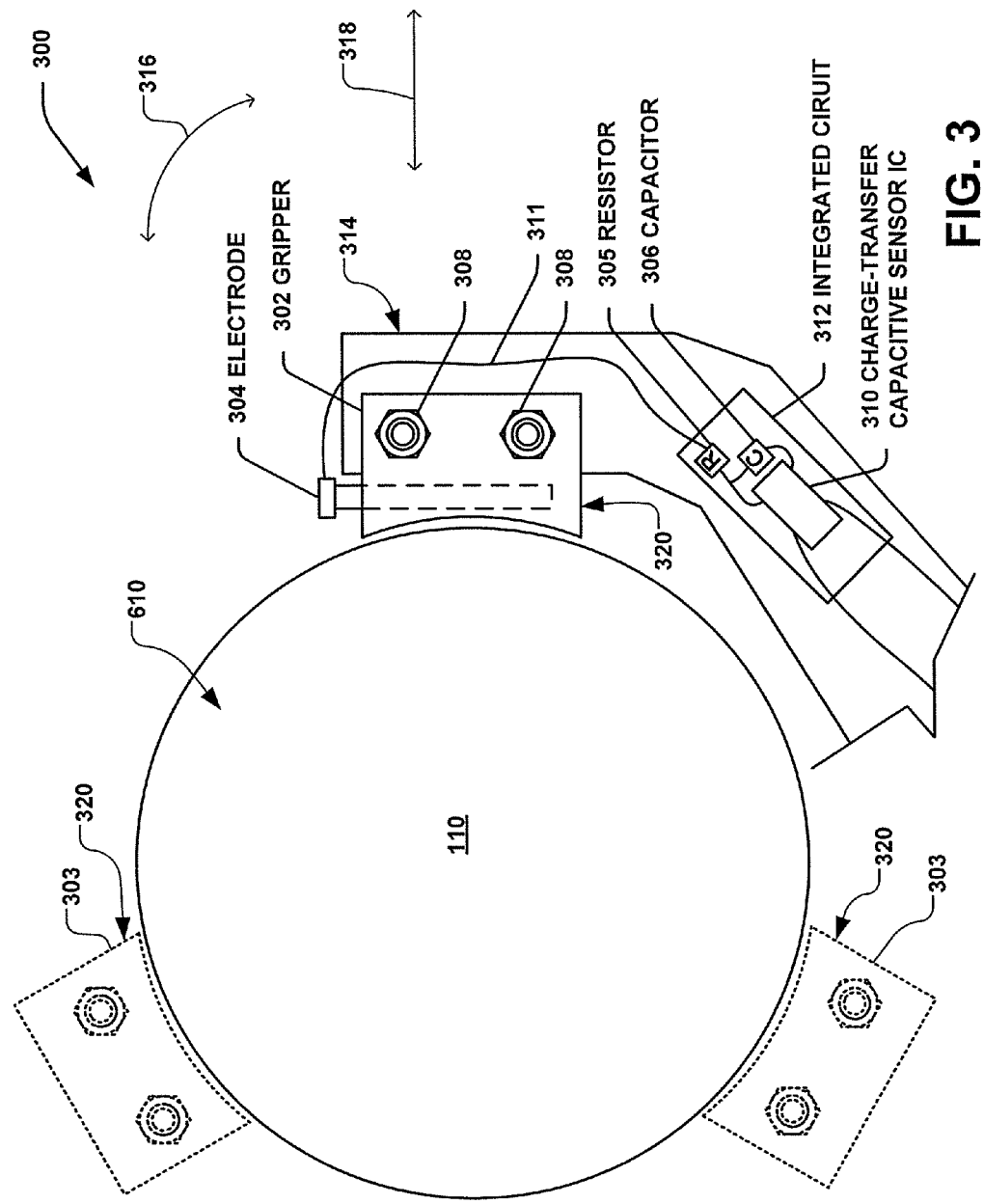
FIG. 3 illustrates yet another exemplary workpiece gripper integrity system that shows the workpiece being held by a gripper in accordance with another aspect of the present invention.

FIG. 3 illustrates a workpiece detection system 300 which comprises a gripper 302, configured with an electrode 304 that can be mounted within the gripper, for example, a shielded conductor 311, a resistor 305, a capacitor 306, an integrated circuit 312 and a charge transfer sensor integrated circuit 310. The gripper 302 can be mechanically mounted to a rotatable or translatable gripper arm assembly 314, for example, utilizing standard fasteners 308, or the gripper 302 can be an integral part of the gripper arm assembly.

In this system 300, the integrated circuit 312 can determine when the gripper 302 is in contact with the workpiece 110 by sensing charge transfer between the sensor electrode 304 and the workpiece 110. The workpiece 110 does not have to come into contact with a switch, for example and so the gripper 302 does not generate additional particles as can happen in a conventional "contact movement type" sensor (e.g., a switch, a plunger, etc.).

Figure 4:
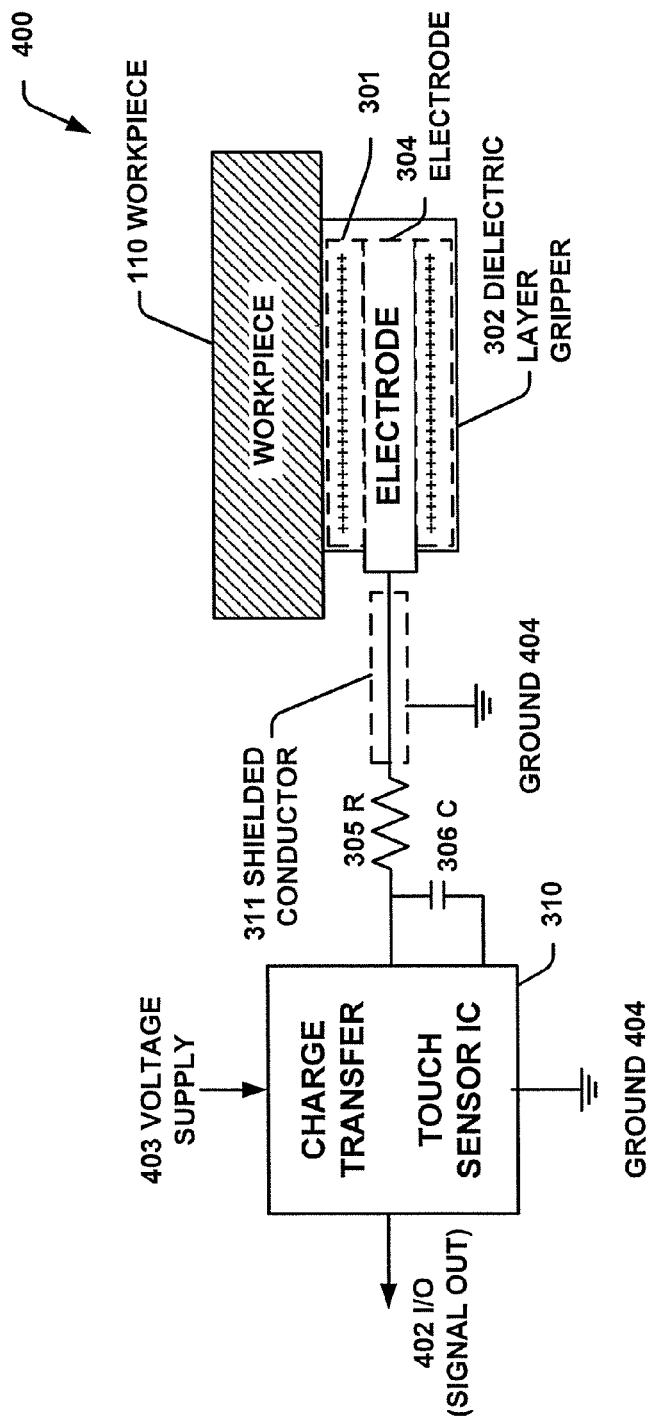
FIG. 4 illustrates an exemplary pictorial schematic of a workpiece detection system in accordance with another aspect of the present invention.

FIG. 4 illustrates a pictorial schematic of the workpiece gripping integrity system 400, illustrated in FIG. 3, as an exemplary aspect of the present invention. A charge-transfer sensor integrated circuit (IC) 310 can be connected to a voltage supply 403, a ground 404, and an I/O 402. The charge-transfer sensing device or electrode 304 can be configured to detect a change in charge associated with a gripper arm assembly 314 illustrated in FIG. 3 based on a grip condition thereof. The gripper arm assembly 314 of FIG. 3 can be rotatable (illustrated as arrow 316), translatable (illustrated as arrow 318), etc., so that the gripper 302 can be brought into contact with the workpiece 110. Components of the workpiece gripping integrity system 400 of FIG. 4 can be connected in-line from the IC 310 to the electrode 304, such as being connected to a capacitor 306 and a resistor 305 through a shielded conductor 311. A change in capacitance to ground is detected on the capacitor 306 by the integrated circuit 310, wherein the integrated circuit can generate a signal 402 representative of a grip condition. To attenuate incoming external interfering fields, the resistor 305 is connected in series with the IC 310 and the shielded conductor 311 is connected to ground 404, for example.

The electrode 304 can be embedded in a gripper 302, wherein the gripper can be constructed of a dielectric material. Voltage can be applied to the electrode 304, creating an electric field 301, which can propagate through the gripper 302, the gripper stores an electric charge. When a workpiece 110 that is constructed of a conductive material (e.g., polysilicon, silicon, and the like) comes into contact with the gripper 302, electrical charge is transferred between the workpiece 110 and the gripper. As discussed supra, the charge-transfer sensor IC 310 detects the slight change in charge and processes it into the output signal 402 that can be analyzed to determine if the workpiece is properly gripped.

Figure 5:
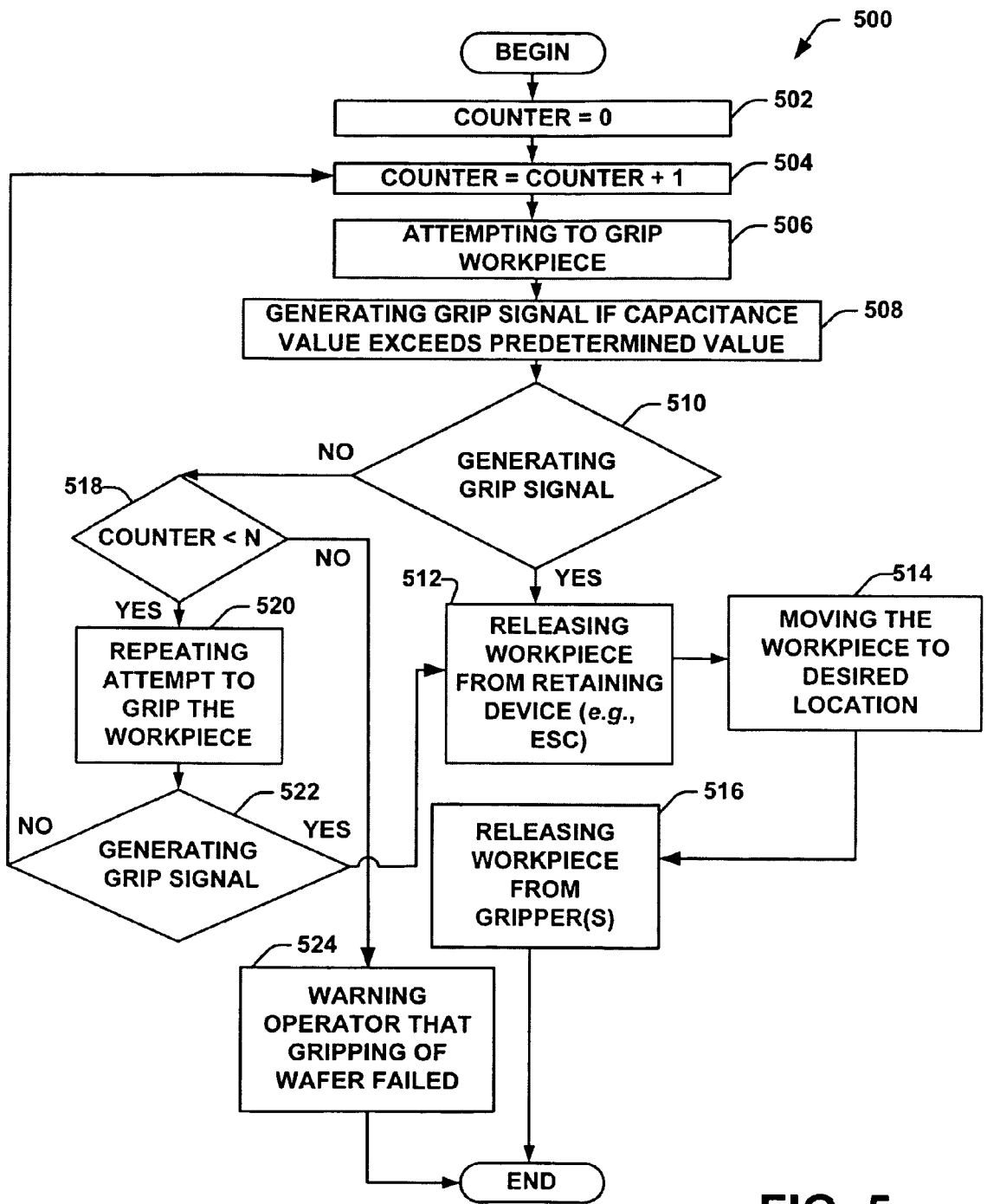
FIG. 5 illustrates an exemplary flow diagram for a workpiece gripper integrity system in accordance with an aspect of the present invention.

According to still another aspect of the present invention, FIG. 5 is a schematic block diagram of an exemplary method 500 illustrating a method of validating gripping, moving and releasing the workpiece, for example. While exemplary methods are illustrated and described herein as a series of acts or events, it will be appreciated that the present invention is not limited by the illustrated ordering of such acts or events, as some steps may occur in different orders and/or concurrently with other steps apart from that shown and described herein, in accordance with the invention. In addition, not all illustrated steps may be required to implement a methodology in accordance with the present invention. Moreover, it will be appreciated that the methods may be implemented in association with the systems illustrated and described herein as well as in association with other systems not illustrated.

As illustrated in FIG. 5, the method 500 begins at 502 wherein a counter is set equal to zero. At 504 the counter is incremented by one. At 506, a grasping device that utilizes a gripper attempts to grip and hold a workpiece. The gripper, for example, can comprise a dielectric material suitable for providing a clamping surface for the semiconductor wafer. The workpiece can be made of a suitable material, for example, silicon. The grasping device can be a device 320 with three grippers 302 and 303, as illustrated in FIG. 3, for example, comprising "curved shaped" gripper pads. The number of grippers and the arrangement of grippers can be any suitable arrangement and gripping of workpieces is well known by those of ordinary skill in the art.

Figure 6:
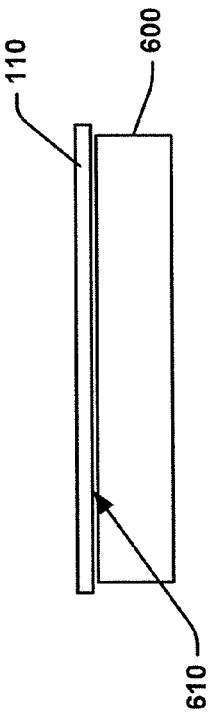
FIG. 6 illustrates an exemplary electrostatic clamp selectively retaining a flat surface of a workpiece in accordance with an aspect of the present invention.

At 508, the charge transfer sensor integrated circuit 310 (FIG. 4) determines whether the workpiece 110 (FIG. 4) has been properly gripped based upon whether charge transfer has taken place between the electrode 304 (FIG. 4) and the workpiece 110 (FIG. 4), as discussed supra. If the IC 310 (FIG. 4) detects a change in capacitance, indicative of proper gripping the IC 310 (FIG. 4) generates a grip signal, for example. The method 500 determines at 510 whether a grip signal has been generated and if it has been detected then the workpiece can be released by a retaining device at 512. The retaining device can be an electrostatic clamp 600 as illustrated in FIG. 6, for example, wherein the electrostatic clamp is configured to selectively retain a flat surface 610 of the workpiece 110, as would be understood by one of ordinary skill in the art. The method proceeds from 512 to 514 wherein the workpiece can be moved to a desired location wherein the grippers can release the workpiece at 516. After the workpiece is released at 516 the method 500 ends.

If the workpiece 110 (FIG. 3) has not been properly gripped, indicated by the absence of a grip signal generated at 510, then the method 500 proceeds to 518 wherein it is determined if the counter is less than the integer N. N represents a pre-set maximum number of gripping attempts that are to be executed in order to grip the workpiece successfully. In the event the maximum number of attempts (N) is reached the method 500 can proceed to 524 wherein a warning is transmitted to an operator of a gripping failure. The warning can be, for example, a flashing light, a sound alarm, etc. If the number stored in the counter is less than N then the method 500 can proceed to 520 where another attempt can be made to grip the workpiece. If the gripping of the workpiece is successful at 520 a grip signal is generated as detected at 522 wherein acts 512, 514 and 516 can be repeated as discussed supra. Otherwise, if a grip signal is not generated and received at 522 the counter number at 504 is incremented and another attempt is made to grip the workpiece at 506. The method 500 will be carried out in trying to grip the workpiece until a grip signal is successfully generated or until the number of gripping attempts is equal to N. It is to be appreciated that there are many methods that can be utilized in attempting to grip and move the workpiece and all such methods are contemplated within this invention.

Because the actual workpiece contact region of the gripper becomes the sensing interface (and contact is required), this sensing device provides the most accurate method for detecting gripping integrity, without generating particles or being invasive. (e.g., this sensing method will detect if the workpiece is loose with the grippers).

It should be noted that thickness and diameter of the wafer, number and spatial arrangement of grippers, type of voltage applied, gripper shape, rate of the wafer movement, and the like, can changed, and such variations are contemplated as falling within the scope of the present invention. Furthermore, such changes of the aforementioned acts can advantageously provide for greater throughput of the various wafers.

Although the invention has been shown and described with respect to a certain preferred embodiment or embodiments, it is obvious that equivalent alterations and modifications will occur to others skilled in the art upon the reading and understanding of this specification and the annexed drawings. In particular regard to the various functions performed by the above described components (assemblies, devices, circuits, etc.), the terms (including a reference to a "means") used to describe such components are intended to correspond, unless otherwise indicated, to any component which performs the specified function of the described component (i.e., that is functionally equivalent), even though not structurally equivalent to the disclosed structure which performs the function in the herein illustrated exemplary embodiments of the invention. In addition, while a particular feature of the invention may have been disclosed with respect to only one of several embodiments, such feature may be combined with one or more other features of the other embodiments as may be desired and advantageous for any given or particular application.

What is claimed is:

1. A workpiece detection system, comprising: a gripper arm assembly comprising a first gripper member, wherein the gripper arm assembly is configured to selectively grip a workpiece between the first gripper member and one or more second gripper members via a selective contact of a dielectric layer of the first gripper member with a peripheral edge of the workpiece;
an electrode operably coupled to the first gripper member;
an integrated circuit configured to detect a change in capacitance between the electrode and ground based on a grip condition of the gripper arm assembly, wherein the grip condition is associated with the first gripper member contacting the workpiece; and
a voltage source operably coupled to the electrode, wherein the dielectric layer of the first gripper member is configured to store an electric charge, and wherein the integrated circuit is further configured to detect a change in the electric charge between the electrode and the workpiece, wherein the change in charge is based on the first gripper member contacting the workpiece.

2. The workpiece detection system of claim 1, wherein the integrated circuit further comprises a charge-transfer sensor integrated circuit, and wherein the charge-transfer sensor integrated circuit is configured to generate an electrical signal representative of the grip condition of the gripper arm assembly.

3. The workpiece detection system of claim 1, wherein the dielectric layer of the first gripper member comprises an insulative dielectric material generally surrounding the electrode.

4. The workpiece detection system of claim 1, wherein the first gripper member is comprised of a dielectric material, and wherein the electrode is generally embedded within the first gripper member.

5. The workpiece detection system of claim 1, wherein the integrated circuit is further configured to detect a change in the electric charge between the electrode and the workpiece, wherein the change in charge is based on the first gripper member contacting the workpiece.

6. The workpiece detection system of claim 1, wherein the grip condition comprises a first grip condition and a second grip condition, wherein in the first grip condition, the first gripper member is in contact with the peripheral edge of the workpiece, and wherein in the second grip condition, the first gripper member does not contact the workpiece.

7. The workpiece detection system of claim 6, wherein the integrated circuit is configured to generate an electrical signal representative of one or more of the first grip condition and second grip condition.

8. The workpiece detection system of claim 6, further comprising a voltage source operably coupled to the electrode, wherein the dielectric layer of the first gripper member comprises an insulative dielectric material generally surrounding the electrode, and wherein the first gripper member is configured to store an electric charge, and wherein the integrated circuit is further configured to detect a change in the electric charge between the electrode and the workpiece, wherein the change in charge is based on the first gripper member contacting the workpiece in the first grip condition.

9. The workpiece detection system of claim 1, wherein the grip condition of the gripper arm assembly comprises a first grip condition and a second grip condition, wherein in the first grip condition, the first gripper member is in contact with the peripheral edge of the workpiece, and wherein in the second grip condition, the first gripper member does not contact the workpiece, wherein the dielectric layer of the first gripper member is configured to store an electric charge when in the second grip condition, and the electric charge is transferred between the workpiece and the first gripper member when the gripper arm assembly is in the first grip condition, and wherein the integrated circuit is further configured to detect a change in the electric charge between the electrode and the workpiece.

10. The workpiece detection system of claim 9, wherein the integrated circuit further comprises a charge-transfer sensor integrated circuit, and wherein the charge-transfer sensor integrated circuit is configured to generate an electrical signal representative of the grip condition of the gripper arm assembly.

11. The workpiece detection system of claim 10, wherein the integrated circuit further comprises a capacitor in series with the electrode, and wherein the electrical signal is further based on a change in capacitance between the capacitor and ground.

12. The workpiece detection system of claim 10, wherein the capacitor and the electrode are electrically connected via a shielded conductor.

13. The workpiece detection system of claim 10, further comprising a resistor in series with the electrode, wherein the resistor is configured to attenuate external interfering fields.

14. The workpiece detection system of claim 1, wherein the integrated circuit is mounted to the gripper arm assembly.

15. The workpiece detection system of claim 1, wherein the electrode generally defines a first electrode of a capacitor, and wherein the workpiece defines a second electrode of the capacitor, and wherein the grip condition varies a capacitance of the capacitor.

16. A workpiece gripping sensor system, comprising:
an ion implantation system configured to implant ions into a workpiece;
an electrostatic clamp configured to selectively retain a flat surface of the workpiece;
a gripper arm assembly configured to selectively grip a peripheral edge of the workpiece between a first gripper member and one or more second gripper members, wherein the gripper arm assembly is further configured to selectively position the workpiece with respect to the electrostatic clamp;
a sensor integrated into one of the plurality of gripper members, wherein the sensor is configured to exhibit a capacitance that is a function of a grip condition of the gripper arm assembly, wherein a first grip condition comprises the plurality of gripper members gripping the workpiece, and a different, second grip condition comprises the plurality of grippers not gripping the workpiece; and
wherein the first grip condition comprises an acceptable quality contact of the one of the plurality of grippers with the workpiece, and wherein a third grip condition comprises an unacceptable quality contact of the one of the plurality of grippers with the workpiece, and wherein the capacitance of the sensor is different for each of the first, second and third grip conditions.

17. The workpiece gripping sensor system of claim 16, wherein the sensor comprises:
a conductive electrode; and
an insulative dielectric material surrounding at least a portion of the conductive electrode, wherein the conductive electrode comprises a first electrode of a capacitor, and wherein the workpiece comprises a second electrode of the capacitor, and wherein the grip condition varies the capacitance of the capacitor.

18. A workpiece gripping integrity device, comprising:
an electrostatic clamp configured to selectively retain a flat surface of the workpiece;
a gripper arm assembly configured to selectively grip a peripheral edge of the workpiece between a plurality of gripper members, wherein the gripper arm assembly is further configured to selectively position the workpiece with respect to the electrostatic clamp;
a charge-transfer sensing device configured to detect a change in capacitance between the gripper arm assembly and ground, wherein the change in capacitance is based on a grip condition of the gripper arm assembly associated with the plurality of grippers contacting the workpiece; and
wherein the charge-transfer sensing device comprises: a conductive electrode; and an insulative dielectric material associated with one of the plurality of gripper members and configured to selectively contact the peripheral edge of the workpiece, wherein the insulative dielectric material surrounds at least a portion of the conductive electrode, wherein the conductive electrode defines a first electrode of a capacitor, and wherein the workpiece defines a second electrode of the capacitor, and wherein the grip condition varies the capacitance of the capacitor.

* * * * *